United States Patent
Li et al.

(10) Patent No.: US 10,847,694 B2
(45) Date of Patent: Nov. 24, 2020

(54) DISPLAY SUBSTRATE AND DISPLAY PANEL (71) Applicant: PLAYNITRIDE INC., Zhubei (TW)

(72) Inventors: Yu-Chu Li, Tainan (TW); Pei-Hsin Chen, Tainan (TW); Yi-Chun Shih, Tainan (TW); Yi-Ching Chen, Tainan (TW); Ying-Tsang Liu, Tainan (TW)

(73) Assignee: PLAYNITRIDE INC., Zhubei (TW)

( * ) Notice: Subject to any disclaimer, the term of this patent is extended or adjusted under 35 U.S.C. 154(b) by 0 days.

(21) Appl. No.: 16/024,494

(22) Filed: Jun. 29, 2018

(65) Prior Publication Data

US 2019/0305199 A1   Oct. 3, 2019

(30) Foreign Application Priority Data

Mar. 28, 2018   (TW) .............................. 107110603 A (51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ..... H01L 2224/0213; H01L 2224/0217; H01L 2224/06133
See application file for complete search history.

(56) References Cited

U.S. PATENT DOCUMENTS

| 2005/0046041 | A1* | 3/2005 | Tsai | H01L 25/16 257/778 |
| 2006/0081869 | A1* | 4/2006 | Lu | H01L 33/405 257/99 |
| 2016/0329257 | A1* | 11/2016 | Scanlan | H01L 21/78 |

* cited by examiner

*Primary Examiner* — Amar Movva
(74) *Attorney, Agent, or Firm* — Maschoff Brennan (57) ABSTRACT

A display substrate comprises a base board and a first bonding pad. The base board comprises a first surface having a first bonding district. The first bonding pad is disposed on the first surface. The first bonding pad is configured to electrically connect to a first electrode of a light emitting component in the first bonding district. The first bonding pad comprises a main bonding portion and an auxiliary bonding portion, wherein at least a part of an orthogonal projection of the main bonding portion on the base board is in the first bonding district. The auxiliary bonding portion electrically connects to the main bonding portion, wherein at least a part of an orthogonal projection of the auxiliary bonding portion on the base board is outside the first bonding district. There is a gap between the main bonding portion and the auxiliary bonding portion.

25 Claims, 9 Drawing Sheets

DISPLAY SUBSTRATE AND DISPLAY PANEL

CROSS-REFERENCE TO RELATED APPLICATIONS

This non-provisional application claims priority under 35 U.S.C. § 119(a) on Patent Application No(s). 107110603 filed in Taiwan on Mar. 28, 2018, the entire contents of which are hereby incorporated by reference.

TECHNICAL FIELD

This disclosure relates to a display substrate and a display panel, particularly to a display substrate and a display panel having a certain extent of transparency.

RELATED ART

With the increasing applied fields of displays, transparent displays have been developed. Transparent display means that the display itself has a certain extent of penetrability and can clearly show the background behind the panel. Transparent displays can be applied to a variety of purposes, such as building windows, car windows, shop windows, or even head-up displays, and are therefore attracting attention from the market.

However, the transparency of a transparent display has reached a bottleneck and cannot be further improved due to the limitation of current materials and processes. In order to seize the opportunity in advance, various manufacturers are trying hard to further enhance the transparency of transparent displays under the current process conditions while maintaining the display quality of transparent displays.

SUMMARY

The present disclosure provides a display substrate and a display panel, so as to further enhance the transmittance of the transparent display under current materials and process conditions.

According to one or more embodiments of this disclosure, a display substrate comprising a base board and a first bonding pad. The base board comprises a first surface, wherein the first surface comprises a first bonding district. The first bonding pad is disposed on the first surface. A part of the first bonding pad is in the first bonding district. The first bonding pad is configured to electrically connect to a first electrode of a light emitting component at the first bonding district. The first bonding pad comprises a main bonding portion and an auxiliary bonding portion. At least a part of an orthogonal projection of the main bonding portion on the base board is in the first bonding district. The auxiliary bonding portion electrically connects to the main bonding portion. At least a part of an orthogonal projection of the auxiliary bonding portion on the base board is outside the first bonding district. There is a gap between the main bonding portion and the auxiliary bonding portion.

According to one or more embodiments of this disclosure, a display panel comprises a light emitting component and a display substrate. The light emitting component comprises a first electrode and a second electrode. The display substrate comprises a base board and a first bonding pad. The base board comprises a first surface, wherein the first surface comprises a first bonding district. The first bonding pad is disposed on the first surface, wherein a part of the first bonding pad is in the first bonding district, the first bonding pad is configured to electrically connect to a first electrode of a light emitting component at the first bonding district. The first bonding pad comprises a main bonding portion and an auxiliary bonding portion. At least a part of an orthogonal projection of the main bonding portion on the base board is in the first bonding district. The auxiliary bonding portion electrically connects to the main bonding portion. At least a part of an orthogonal projection of the auxiliary bonding portion on the base board is outside the first bonding district. There is a gap between the main bonding portion and the auxiliary bonding portion.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
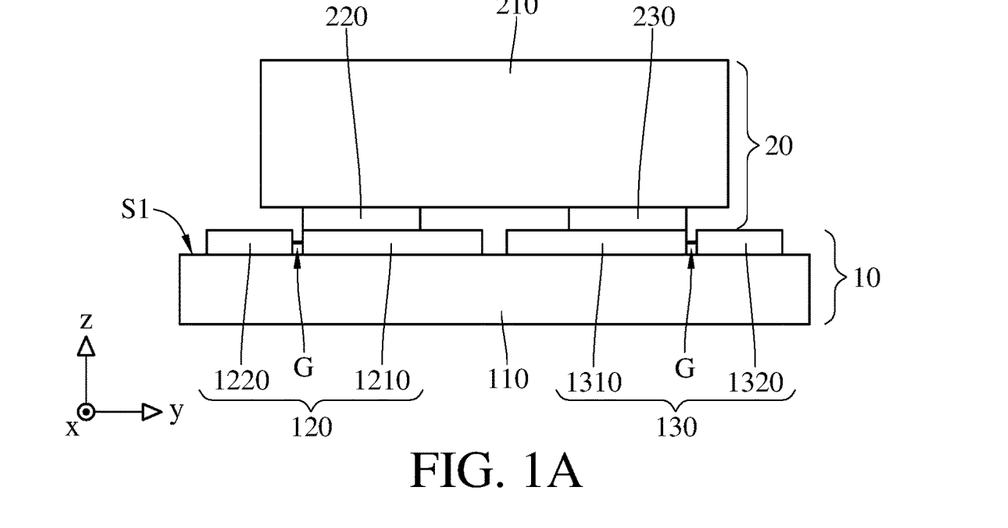
FIG. 1A illustrates a schematic of the structure of the display panel according to the first embodiment of the present disclosure.
Figure 1B:
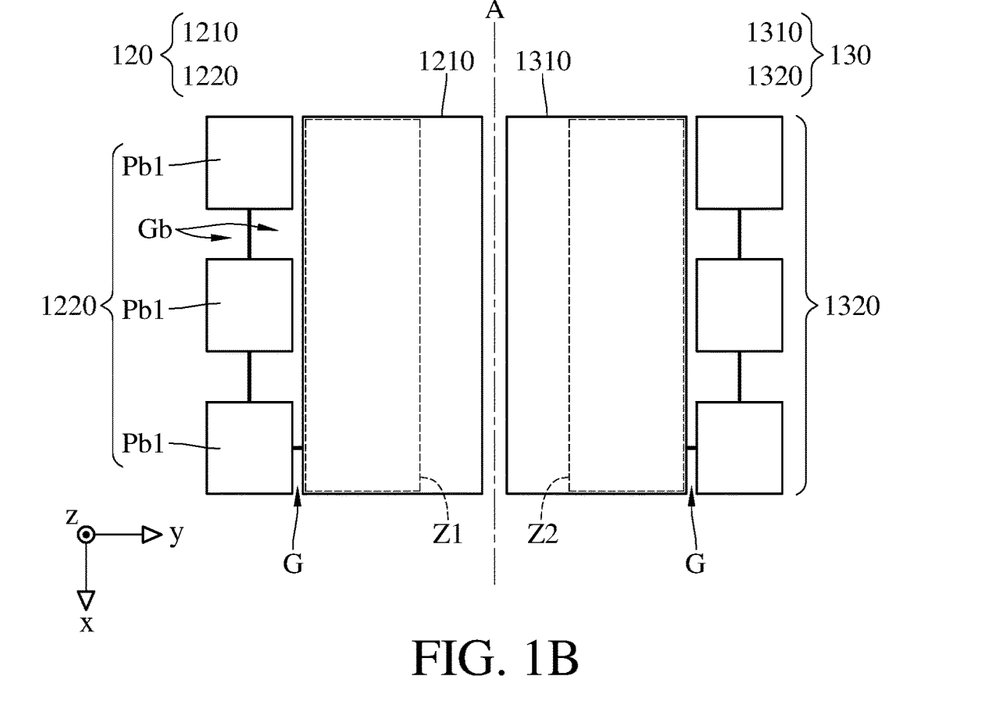
FIG. 1B illustrates a top view of the bonding pad of the display panel according to the first embodiment of the present disclosure.

Please refer to FIG. 1A and FIG. 1B, FIG. 1A is a schematic of the structure of the display panel according to the first embodiment of the present disclosure, and FIG. 1B is a top view of the bonding pad of the display substrate according to the first embodiment of the present disclosure. The display panel comprises a display substrate 10 and a light emitting component 20 as shown in FIG. 1A. The light emitting component 20 is disposed on the display substrate 10. Practically, the light emitting component 20 is fixed on the display substrate 10 by, for example, a bump, but not limited thereto.

The light emitting components 20 comprises a body 210, a first electrode 220 and a second electrode 230. The body 210 is an epitaxial structure, said epitaxial structure comprises, for example, a plurality of semiconductor material layers with different doping types and at least one light emitting semiconductor material layer for emitting the light. The structure of the body 210 is not limited herein. The first electrode 220 and the second electrode 230 have different electrical properties, and are configured to connect different semiconductor material layers and external signals. The first electrode 220 and the second electrode 230 are, for example, metals of high work function (such as platinum, nickel, titanium, gold, chromium, silver, alloy of metals mentioned above, and a combination thereof), metal oxides (such as ITO (Indium Tin Oxide), IGZO (Indium Gallium Zinc Oxide), ITZO (Indium Tin Zinc Oxide), and zinc oxide) or conductive non-metal materials such as conductive polymers, graphite, graphene, and black phosphorus. Taking metal material for example, said metal material of high work function is the metal material whose work function is not less than 4.5 electron volts. The first electrode 220 and the second electrode 230 are preferably conductive materials with high transmittance, such as conductive materials with transmittance higher than 80%. The light emitting component is such as LED (Light Emitting Diode), mini LED, or micro-LED, but not limited by the above examples. In practice, said epitaxial structure may comprise II-VI materials such as ZnSe (Zinc Selenide) or III-V nitride material such as GaN (Gallium Nitride), AlN (Aluminium Nitride), InN (Indium Nitride), InGaN (Indium Gallium Nitride), AlGaN (Aluminium Gallium Nitride) and AlInGaN (Aluminium Indium Gallium). The thickness of the epitaxial structure is preferably less than or equal to 6 micrometers and the thickness of the epitaxial structure is usually greater than 1 micrometer, and the yield rate of the process is affected by the thickness.

The display substrate 10 comprises a base board 110 and a first bonding pad 120. The base board 110 comprises a first surface S1, wherein the first surface S1 comprises a first bonding district Z1. The base board 110 is, for example, a glass substrate, a sapphire substrate or other substrates with high transmittance. Wirings or circuits can be disposed on the base board 110 for driving the light emitting component 20. The first bonding pad 120 is disposed on the first surface S1, wherein a part of the first bonding pad 120 is in the first bonding district Z1. The first bonding pad 120 is configured to electrically connect to a first electrode 220 of a light emitting component 20 at the first bonding district Z1. In another view, the first electrode 220 is disposed on the predetermined position of the base board 110 in the ideal case, thus the first bonding district Z1 is just a region covered by an orthographic projection of the first electrode 220 on the base board 110 in an ideal case. Similarly, the first surface S1 of the base board 110 further comprises a second bonding district Z2, the display substrate 10 further comprises a second bonding pad 130 disposed on the base board 110, and the second bonding pad 130 is configured to electrically connect to a second electrode 230 of the light emitting component 20 at the second bonding district Z2. The first bonding pad 120 and the second bonding pad 130 are, for example, metals of high work function (such as platinum, nickel, titanium, gold, chromium, silver, alloy of metals mentioned above, and a combination thereof), metal oxides (such as ITO (Indium Tin Oxide), IGZO (Indium Gallium Zinc Oxide), ITZO (Indium Tin Zinc Oxide), and zinc oxide) or conductive non-metal materials such as conductive polymers, graphite, graphene, and black phosphorus. The first bonding pad 120 and the second bonding pad are preferably conductive materials with high transmittance but not limited thereby.

The first bonding pad 120 comprises a main bonding portion 1210 and an auxiliary bonding portion 1220. There is a gap G between the main bonding portion 1210 and the auxiliary bonding portion 1220. The main bonding portion 1210 and the auxiliary bonding portion 1220 have the same electrical property. At least a part of an orthogonal projection of the main bonding portion 1210 on the base board 110 is in the first bonding district Z1. The auxiliary bonding portion 1220 electrically connects to the main bonding portion 1210. At least a part of an orthogonal projection of the auxiliary bonding portion 1220 on the base board 110 is outside the first bonding district Z1. In other words, the first electrode 220 of the light emitting component 20 electrically connects to the main bonding portion 1210 of the first bonding pad 120 in an ideal case.

Similarly, the second bonding pad 130 comprises a main bonding portion 1310 and an auxiliary bonding portion 1320. There is a gap G between the main bonding portion 1310 and the auxiliary bonding portion 1320. The main bonding portion 1310 and the auxiliary bonding portion 1320 have the same electrical property. The second electrode 230 of the light emitting component 20 electrically connects to the main bonding portion 1310 of the second bonding pad 130 in an ideal case. In this embodiment, the first bonding pad 120 and the second bonding pad 130 are symmetric with respect to an axis A of symmetry between the first bonding district Z1 and the second bonding district Z2, but this is not a limitation. The following paragraph mainly introduces the first bonding pad 120 for simplifying the descriptions.

The auxiliary bonding portion 1220 comprises a plurality of auxiliary bonding blocks Pb1. These auxiliary bonding blocks Pb1 electrically connect to each other directly or indirectly. More specifically, each auxiliary bonding block Pb1 may connect each other to form a direct electrical connection, or each auxiliary bonding block Pb1 may only connect to adjacent auxiliary bonding blocks Pb1, and form an indirect electrical connection with the auxiliary bonding block Pb1 farther away via the adjacent auxiliary bonding blocks Pb1. There is a pad gap Gb between two of the auxiliary bonding blocks Pb1.

The light emitting component 20 is connected to the first bonding pad 120 and the second bonding pad 130 as previously described, so that the light emitting component 20 may get the electricity or driving signals through the first bonding pad 120 and the second bonding pad 130. As previously described, the first electrode 220 electrically connects to the main bonding portion 1210 of the first bonding pad 120. However, the first electrode 220 may deviate from the ideal position during the actual bonding process. Taking an example of micro LED as the light emitting components 20, a great number of light emitting components 20 are transferred from the epitaxy substrate to the display substrate 10 at the same time by a process called "mass transfer". The relative positions of some light emitting components 20 may change during the process of mass transfer. The auxiliary bonding portion 1220 can provide a tolerance space for the process error.

Figure 2A:
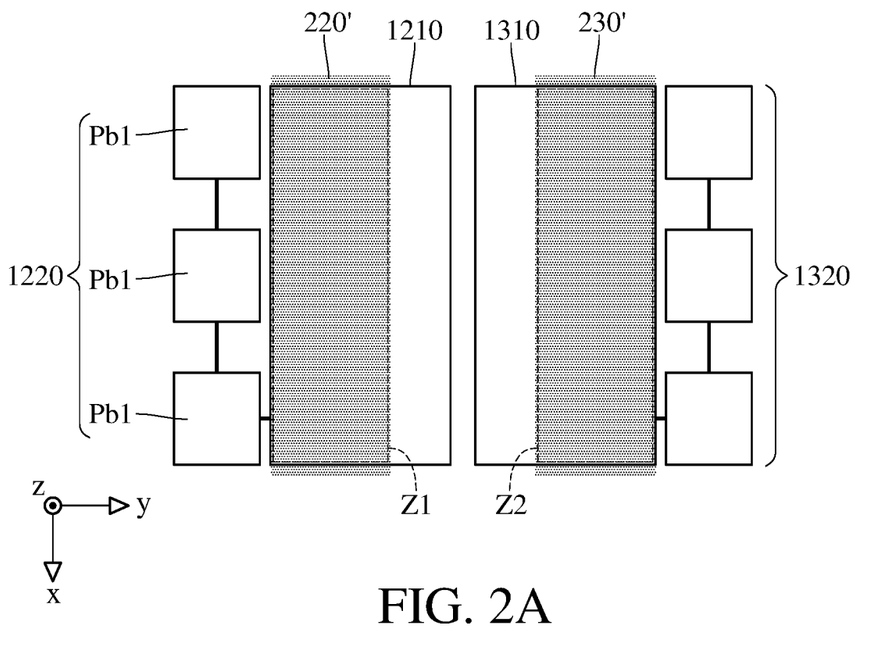
FIG. 2A illustrates a schematic of the ideal relative position of the display substrate and the first electrode and the second electrode of the light emitting component according to the first embodiment of the present disclosure.
Figure 2B:
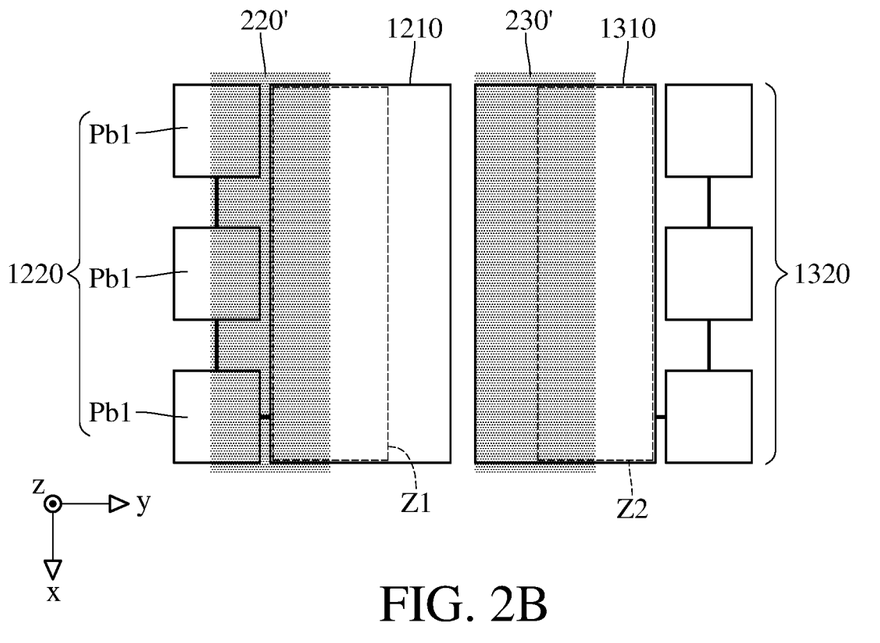
FIG. 2B illustrates a schematic of the non-ideal relative position of the display substrate and the first electrode and the second electrode of the light emitting component according to the first embodiment of the present disclosure.
Figure 2C:
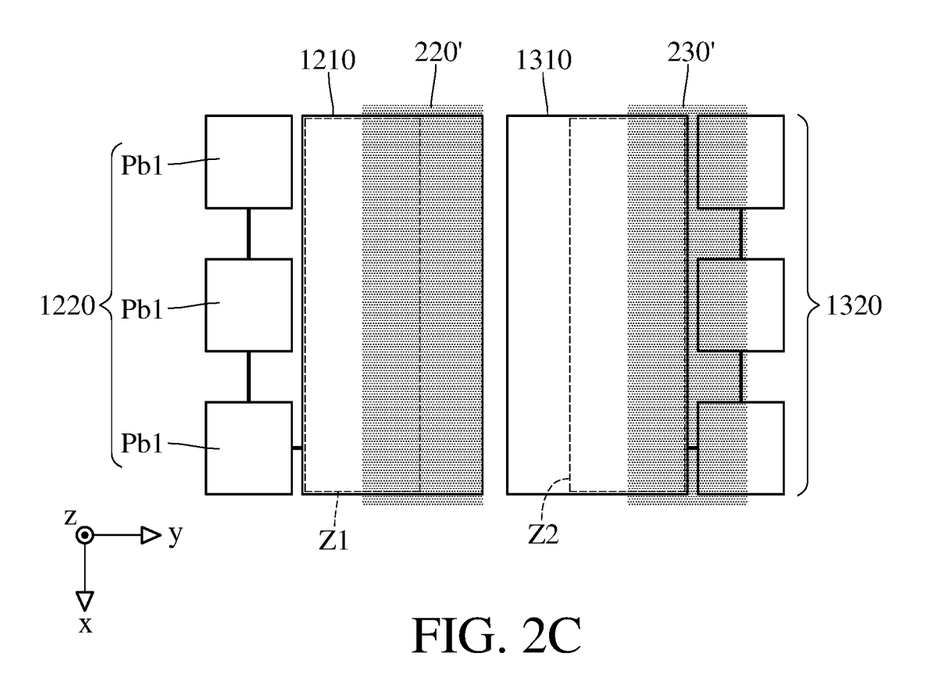
FIG. 2C illustrates another schematic of the non-ideal relative position of the display substrate and the first electrode and the second electrode of the light emitting component according to the first embodiment of the present disclosure.

Please refer to FIG. 2A to FIG. 2C for illustrating the effect of process error on the bonding of the light-emitting component 20 and the display substrate 10. FIG. 2A illustrates a schematic of the ideal relative position of the display substrate 10 and the first electrode 220 and the second electrode 230 of the light emitting component 20 according to the first embodiment of the present disclosure. FIG. 2B illustrates a schematic of the non-ideal relative position of the display substrate 10 and the first electrode 220 and the second electrode 230 of the light emitting component 20 according to the first embodiment of the present disclosure. FIG. 2C illustrates another schematic of the non-ideal relative position of the display substrate 10 and the first electrode 220 and the second electrode 230 of the light emitting component 20 according to the first embodiment of the present disclosure. Since the light emitting component 20 overlaps with multiple components of the display substrate 10 from the top view, in FIG. 2A to FIG. 2C and the following figures, the orthogonal projections of the first electrode 220 and the second electrode 230 on the base board 110 are shown to represent positions of the first electrode 220 and the second electrode 230, and the regions (220', 230') marked by screentone represent the orthogonal projections of the first electrode 220 and the second electrode 230 on the base board 110.

In the ideal case, the orthogonal projection 220' of the first electrode 220' on the base board 110 is mainly in the first bonding district Z1 as shown in FIG. 2A. In a kind of non-ideal case, the light emitting component 20 slightly deviates to the left side of the drawing so that the orthogonal projection 220' of the first electrode 220 on the base board 110 covers part of the auxiliary bonding portion 1220 as shown in FIG. 2B. Meanwhile, the first electrode 220 electrically connects to the main bonding portion 1210 and an auxiliary bonding portion 1220 of the first bonding pad 120 through other conductors (such as the bump as previously described) in a direct manner or in an indirect manner. In another kind of non-ideal case, the light emitting component 20 slightly deviates to the right side of the drawing so that the orthogonal projection 230' of the first electrode 230 on the base board 110 covers part of the auxiliary bonding portion 1220 as shown in FIG. 2C. Meanwhile, the second electrode 230 electrically connects to the main bonding portion 1310 and an auxiliary bonding portion 1320 of the second bonding pad 130 through other conductors (such as the bump as previously described) in a direct manner or in an indirect manner. As a result, the auxiliary bonding portion 1220 and the auxiliary bonding portion 1230 provide a required tolerance space during the bonding process.

In the past, the bonding pads on the substrate reserved space for process errors. However, the conventional bonding pad does not have corresponding design for electrodes of the light emitting components 20, it is usually a single-piece electrical conductor which consumes considerable space of the base board 110 and it affects the transmittance (also known as light transmittance or transparency) of the display substrate 10 and the display panel 1. The light transmittance, in a kind of definition, refers to the total amount of light that passes through the medium after subtracting reflectivity, refractivity, absorptivity, and dispersion.

In the embodiments provided by the present disclosure, in addition to the wirings for electrically connections, there is a pad gap Gb between adjacent auxiliary bonding blocks Pb1. There is also a gap G between each auxiliary bonding block Pb1 and the main bonding portion 1210 in this embodiment. From another point of view, these pad gaps Gb and gap G allow the first pad to have at least one hollow region. Therefore, light provided by some of light emitting components 20 can pass the display substrate 10 through said at least one hollow region without blocking by the display substrate 10 when a side of the display substrate 10 is used as a light-exiting side, thus improving the overall transmittance of the display panel 1 (or display substrate 10).

In an embodiment, the area of the orthogonal projection of the main bonding portion 1210 on the base board 110 is greater than the area of the orthogonal projection of one of the auxiliary bonding blocks Pb1 on the base board 110 for ensuring the effect of bonding between the light emitting component 20 and the display substrate 10, and for improving the transmittance of the display panel 1 or the display substrate 10. The ratio of the area of the orthogonal projection of one of the auxiliary bonding blocks Pb1 on the base board 110 and the area of the orthogonal projection of the main bonding portion 1210 on the base board 110 is between 0.2 to 0.8. In an embodiment, the width of each auxiliary bonding block is less than or equal to 6 μm (micrometers), while the width greater than 6 μm affects the transmittance.

In another embodiment, the contact area of the first electrode 220 and the first bonding pad 120 is less than or equal to the area of an orthogonal projection of the first electrode 220 on the base board 110. In an implementation manner, the ratio of the contact area of the first electrode 220 and the first bonding pad 120 and the area of an orthogonal projection of the first electrode 220 on the base board 110 is less than or equal to 0.8 and greater than or equal to 0.2, while the transmittance will be affected when the ratio is greater than 0.8 and uniformity of the electrical connection will be affected when the ration less than 0.2.

In an embodiment, the contact area of the first electrode 220 and the first bonding pad 120 is less than or equal to the area of the orthogonal projection of the light emitting component 20 on the base board 110. In an implementation manner, the ratio of the contact area of the first electrode 220 and the first bonding pad 120 and the area of the orthogonal projection of the light emitting component 20 on the base board 110 is less than or equal to 0.8. Preferably, the ratio of the contact area of the first electrode 220 and the first bonding pad 120 and the area of the orthogonal projection of the light emitting component 20 on the base board 110 is less than or equal to 0.8 when the light emitting component 20 is a vertical light emitting component; the ratio of the contact area of the first electrode 220 and the first bonding pad 120 and the area of the orthogonal projection of the light emitting component 20 on the base board 110 is less than or equal to 0.5 when the light emitting component 20 is a flip chip light emitting component. The contact area of the bonding pad and the corresponding electrode is sufficiently large to maintain the bonding effect, and the gap between the first bonding pad 120 and the second bonding pad 130 is large enough to allow the light provided by the light emitting component 20 to pass through said gap for improving the transmittance according to the above embodiment.

Figure 3:
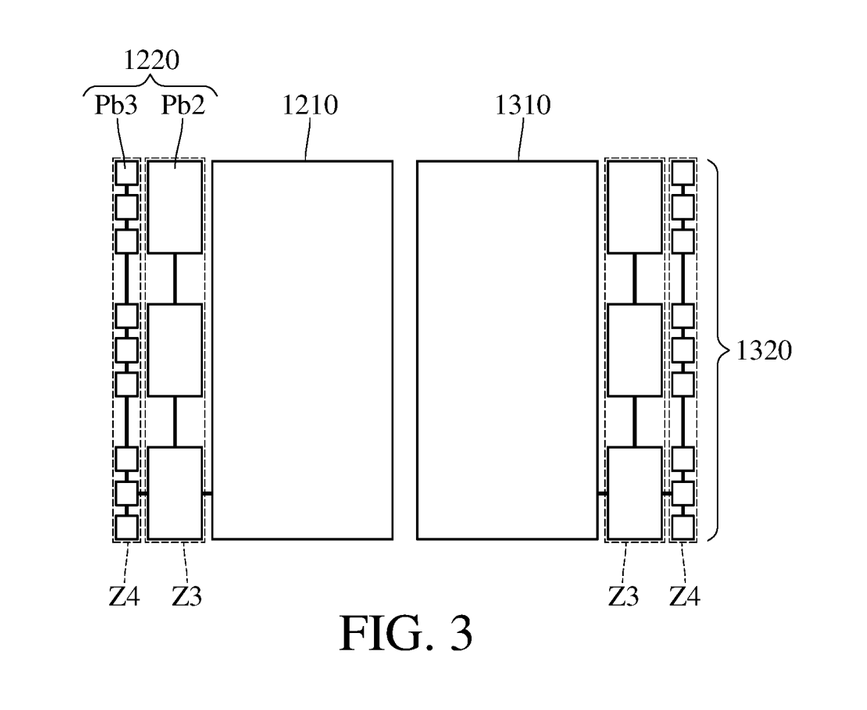
FIG. 3 illustrates a top view of the display substrate according to the second embodiment of the present disclosure.

Please refer to FIG. 3, which illustrates a top view of the display substrate 10 according to the second embodiment of the present disclosure. Different from the first embodiment shown in FIG. 1, the auxiliary bonding portion 1220 of the first bonding pad 120 of the display substrate 10 comprises auxiliary bonding blocks Pb2 and auxiliary bonding blocks Pb3 in the second embodiment shown in FIG. 3. Compared to the first embodiment, in the second embodiment, the total area of the auxiliary bonding blocks Pb2 and the auxiliary bonding blocks Pb3 is less than the area of the auxiliary bonding blocks Pb1. Therefore, there are more gaps between the auxiliary bonding blocks Pb2 and the auxiliary bonding blocks Pb3, the transmittance of the display panel 1 improves thereby, and it can reserve spaces ahead for process errors. Especially, the area of the main bonding portion 1220 is greater than the area of each auxiliary bonding block Pb2, and the area of each auxiliary bonding block Pb2 is greater than the area of each auxiliary bonding block Pb3, i.e., the element's area is smaller when the distance between said element and first bonding area Z1 is longer, and such property may improve the transmittance.

Detailing the structure shown in FIG. 3, the base board further comprises a tolerance district Z3 and a discrete district Z4. The tolerance district Z3 is closer to the first bonding district Z1 than the discrete district Z4. The auxiliary blocks Pb2 and the auxiliary bonding blocks Pb3 are in the tolerance district Z3 or in the discrete district Z4. The distance between any one of the auxiliary bonding blocks in the tolerance district Z3 and the first bonding district Z1 is smaller than a distance between any one of the auxiliary bonding blocks in the discrete district Z4 and the first bonding district Z1. In the second embodiment shown in FIG. 3, the auxiliary bonding blocks Pb2 are in the tolerance district Z3, and the auxiliary bonding blocks are in the discrete district Z4, thus the distance between every auxiliary bonding block Pb2 and the first bonding district Z1 is smaller than the distance between every auxiliary bonding block Pb3 and the first bonding district Z1.

It should be noticed that the tolerance district Z3 and the discrete district Z4 are defined to facilitate the description of the distances between the main bonding portion 1210 and the auxiliary bonding blocks Pb2 and distances between the main bonding portion 1210 and the auxiliary bonding blocks Pb3, and are not intended to limit the embodiments provided by the present disclosure. Regarding the first electrode 220 in the first embodiment with a kind of definition, except for the first bonding district Z1, the tolerance district Z3 and the discrete district Z4 are more likely to be the region of the orthogonal projection of the first electrode 220 on the base board 110 in a non-ideal case, and the probability that the orthogonal projection of the first electrode 220 on the base board 110 locates in the tolerance district Z3 is higher than the probability that the orthogonal projection of the first electrode 220 on the base board 110 locates in the discrete district Z4 while the tolerance district Z3 is between the first bonding district Z1 and the discrete district Z4. Alternatively, in another kind of definition, the tolerance district Z3 can be defined as a region expanded in at least one direction from the first bonding district Z1 in a certain proportion and said region is outside the original first bonding district Z1, while the discrete district Z4 can be defined as another region expanded in at least one direction from the first bonding district Z1 in a certain proportion and said region is outside the original first bonding district Z1 and the tolerance district Z3. In this embodiment, the tolerance district Z3 and the discrete district Z4 are formed by expanding from the first bonding district Z1 along the y-axis. Practically, the tolerance district Z3 and the discrete district Z4 may also be formed by expanding from the first bonding district Z1 along the x-axis or along both x-axis and y-axis. The above examples are merely exemplary and not limited thereto. Particularly, because the tolerance district Z3 and the discrete district Z4 are defined to facilitate the description of the distances between the main bonding portion 1210 and the auxiliary bonding blocks Pb2 and distances between the main bonding portion 1210 and the auxiliary bonding blocks Pb3, the ratio of the area of the tolerance district Z3 and the discrete district Z4 is less than a default threshold value, for example, the ratio is less than or equal to one.

In an embodiment, the total area of orthogonal projections of the auxiliary bonding blocks Pb2 on the base board 110 is greater than the total area of orthogonal projections of the auxiliary bonding blocks Pb3. In this embodiment, the area of the orthogonal projection of any one of the auxiliary bonding blocks Pb2 on the base board 110 is greater than the area of the orthogonal projection of any one of the auxiliary bonding blocks Pb3 on the base board 110. Since the probability that each auxiliary bonding block Pb3 is configured to electrically connect to the first electrode 220 is small, this design not only maintains the fault-tolerant space of the bonding process, but also relatively improves the transmittance of the display panel 1 or the display substrate 10.

Figure 4:
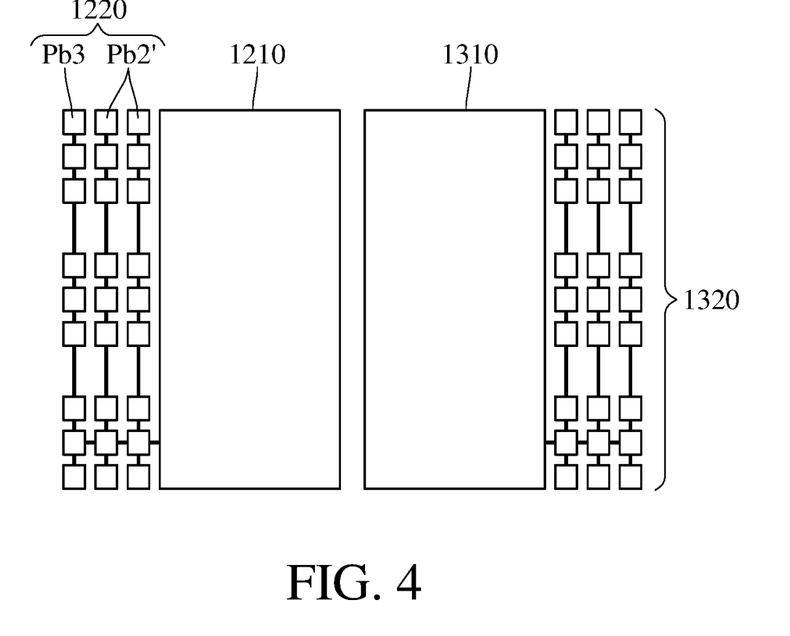
FIG. 4 illustrates a top view of the display substrate according to the third embodiment of the present disclosure.

Please refer to FIG. 4, which illustrates a top view of the display substrate 10 according to the third embodiment of the present disclosure. Similar to the structure shown in FIG. 3, each auxiliary bonding blocks Pb2 shown in FIG. 3 can be further patterned into the auxiliary bonding blocks Pb2' shown in FIG. 4 for further decreasing the areas occupied by the auxiliary bonding portions 1220, 2220, increasing gaps between auxiliary bonding blocks Pb2', and improving the transmittance of the display panel 1 or the display substrate 10 thereby.

Figure 5:
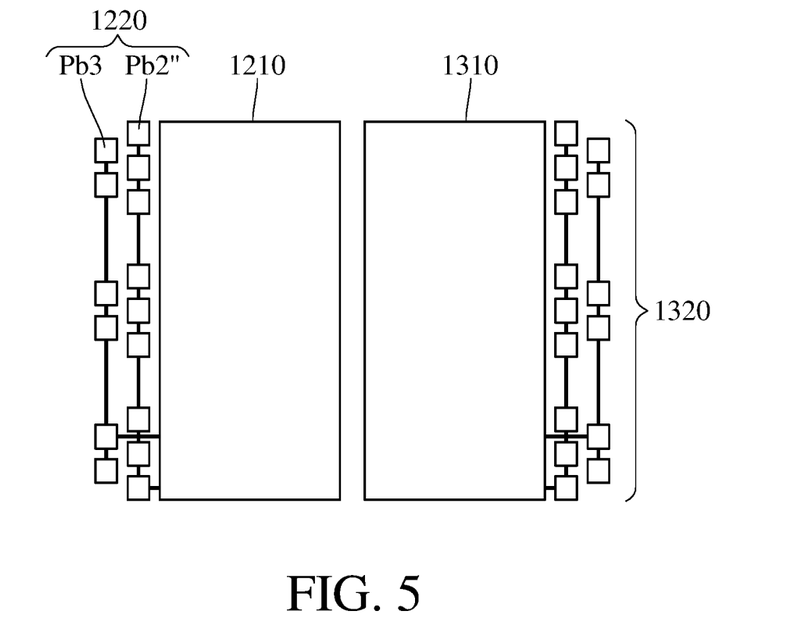
FIG. 5 illustrates a top view of the display substrate according to the fourth embodiment of the present disclosure.

Please refer to FIG. 5, which illustrates a top view of the display substrate 10 according to the fourth embodiment of the present disclosure. The probability that the auxiliary bonding blocks Pb2' farther from the first bonding district Z1 are configured to electrically connect to the first electrode 220 is smaller, therefore the number of the auxiliary bonding blocks Pb2 can be further decreased in this embodiment. In terms of probability, this does not greatly affect the bonding relationship between the light emitting component 20 and the display substrate 10, and the transmittance of the display panel 1 or the display substrate 10 can be further improved.

Figure 6:
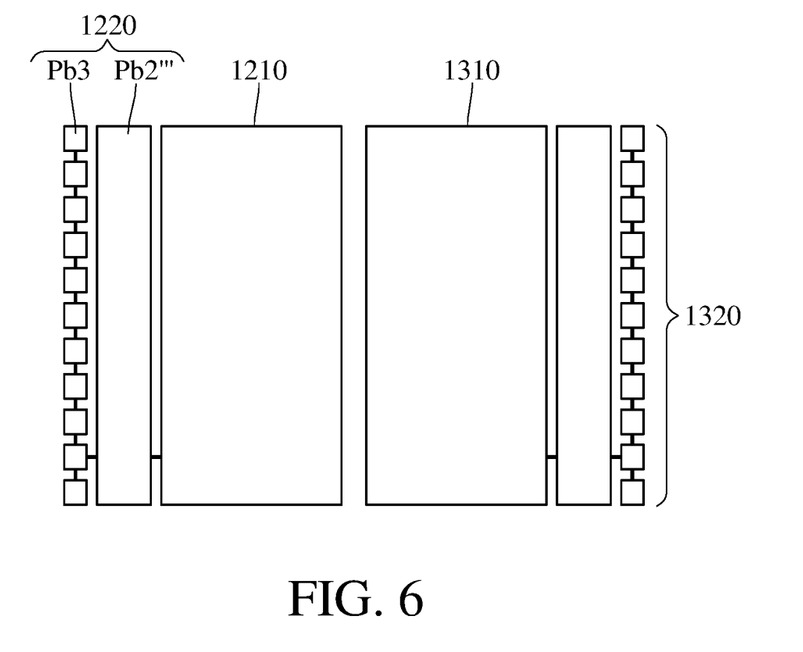
FIG. 6 illustrates a top view of the display substrate according to the fifth embodiment of the present disclosure.

Please refer to FIG. 6, which illustrates a top view of the display substrate 10 according to the fifth embodiment of the present disclosure. The structure in this embodiment is similar to the structure shown in FIG. 3, the difference is that the auxiliary bonding block Pb2''' is a complete block in this embodiment and the gaps between adjacent auxiliary bonding blocks Pb2 are substantially identical to facilitate manufacture and to ensure the electrical effect after bonding with the light emitting component 20.

Figure 7:
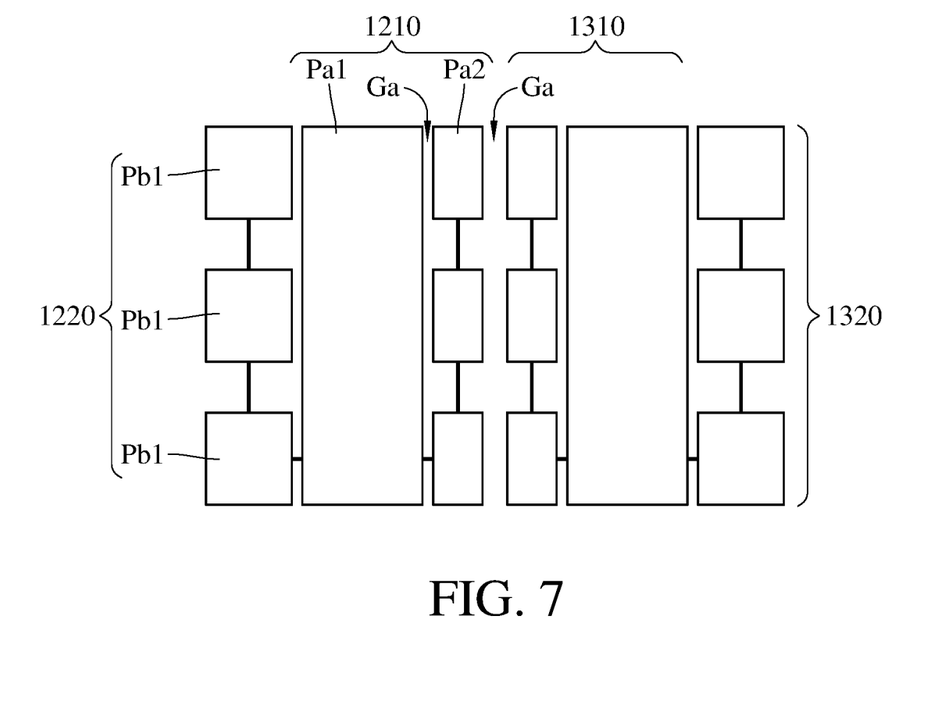
FIG. 7 illustrates a top view of the display substrate according to the sixth embodiment of the present disclosure.

Please refer to FIG. 7, which illustrates a top view of the display substrate 10 according to the sixth embodiment of the present disclosure. In this embodiment, the main bonding portion 1210 comprises a main bonding block Pa1 and a plurality of main bonding blocks Pa2. Similar to the concept mentioned previously, since the probability that the part of main bonding block 1210 corresponding to the main bonding blocks Pa2 is configured to electrically connect to the electrodes of the light emitting component 20 is lower, said part of main bonding block 1210 is further be patterned as main bonding blocks Pa2 in this embodiment. There are pad gaps Ga between main bonding blocks and there are also pad gaps Ga between the main bonding portion 1210 and main bonding blocks Pa2. During the process of bonding the light emitting component 20 on the display substrate 10, bumps are used to fix the light emitting component 20 on the display substrate 10, so that the bumps also become obstacles against light transmission. As a result, decreasing the area of the main bonding portion 1210 may reduce obstacles on the light traveling paths, and the transmittance of the display substrate 10 or the display panel 1 can be further improved while the light emitting element 20 and the display substrate 10 are normally bonded.

Figure 8A:
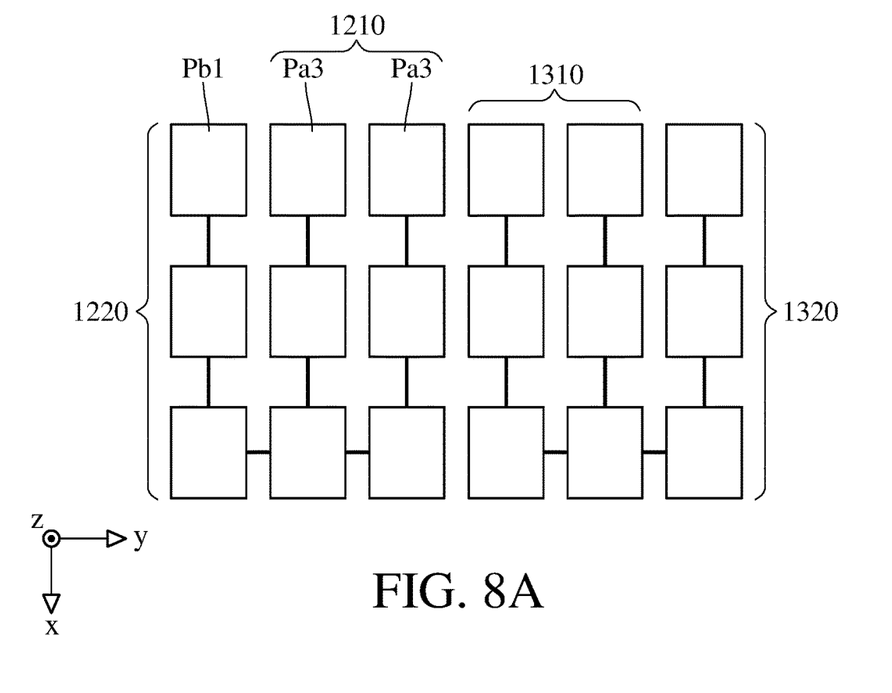
FIG. 8A illustrates a top view of the display substrate according to the seventh embodiment of the present disclosure.
Figure 8B:
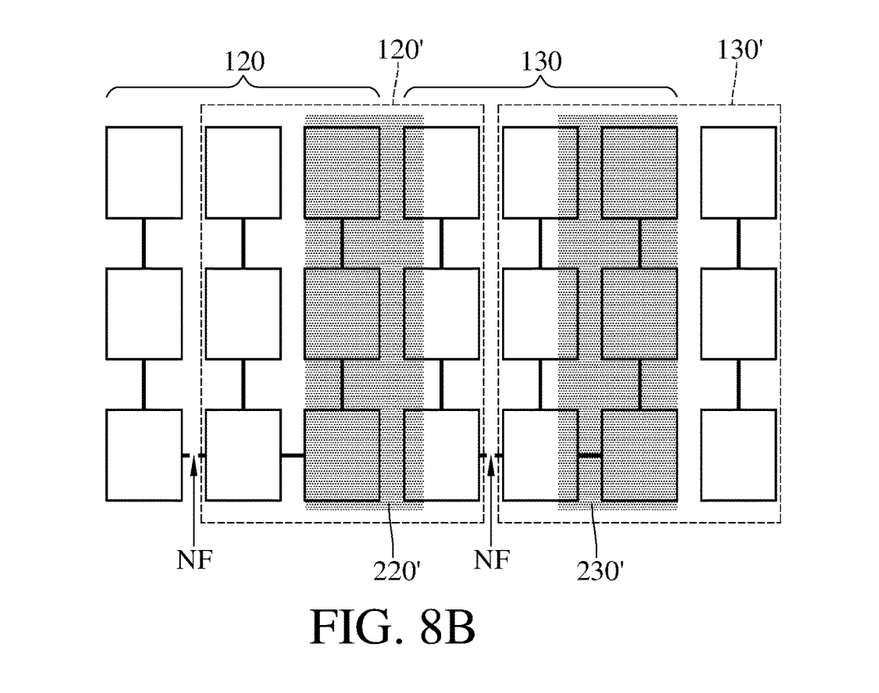
FIG. 8B illustrates a dislocation schematic of the display substrate and the light emitting component according to the seventh embodiment of the present disclosure.

Please refer to FIG. 8A and FIG. 8B. FIG. 8A illustrates a top view of the display substrate 10 according to the seventh embodiment of the present disclosure. FIG. 8B illustrates a dislocation schematic of the display substrate 10 and the light emitting component 20 according to the seventh embodiment of the present disclosure. Said dislocation means that electrodes and bonding pad are not ideally bonded. In this embodiment, the main bonding portion 1210 is patterned into a plurality of main bonding blocks Pa3, these main bonding blocks Pa3 electrically connect to each other directly or indirectly. There are pad gaps Ga between adjacent main bonding blocks Pa3. In this embodiment, the size of each main bonding block Pa3 is similar to the size of each auxiliary bonding block Pb1 for the reason of manufacture convenience.

On the other hand, the main bonding blocks Pa3 and the auxiliary bonding Pb1 are arranged in a 2-dimensional array form. The bonding blocks in the same row column electrically connect to each other, bonding blocks in one row of the 2-dimensional array electrically connect to each other. The direction of said row is along the y-axis while the direction of said column is along the x-axis. Please refer to FIG. 8B, based on such structure, when the light emitting components 20 is so far from the ideal bonding position that the light emitting component 20 electrically connects to the first bonding pad 120 and the second bonding 130 concurrently, the wiring on the repairing node NF can be disconnected, and a new first bonding pad 120' and a new second bonding pad 130' are formed from said 2-dimensional array of bonding blocks. Since the wiring on the repairing node NF has been disconnected so it will not cause a short circuit. In practice, a new wiring can be additionally added during the repairing process so that bonding blocks of the first bonding pad 120' electrically connect to each other directly or indirectly and are able to receive external signals.

In a kind of implementation manner, the area of the orthogonal projection of one of the main bonding blocks Pa3 on the base board 110 is greater than or equal to the area of the orthogonal projection of one of the auxiliary bonding blocks Pb1 on the base board 110 for ensuring the effect of bonding between the light emitting component 20 and the display substrate 10 and improving the transmittance of the display panel 1 or the display substrate 10. The ratio of the area of the orthogonal projection of one of the auxiliary bonding blocks Pb1 on the base board 110 and the area of the orthogonal projection of one of the main bonding blocks Pa3 on the base board 110 is between 0.5 and 1. In this embodiment, the first bonding pad 120 is patterned into a plurality of main bonding blocks Pa3 and a plurality of auxiliary bonding blocks Pb1, and both the width of every main bonding block Pa1 and the width of every auxiliary bonding block are not greater than 6 μm. Preferably, both the width of every main bonding block Pa1 and the width of every auxiliary bonding block are less the 3 μm, so that the gap between the first bonding pad 120 and the second bonding pad 130 is large enough for the light provided by the light emitting component 20 can pass thus improving the transmittance.

Figure 9:
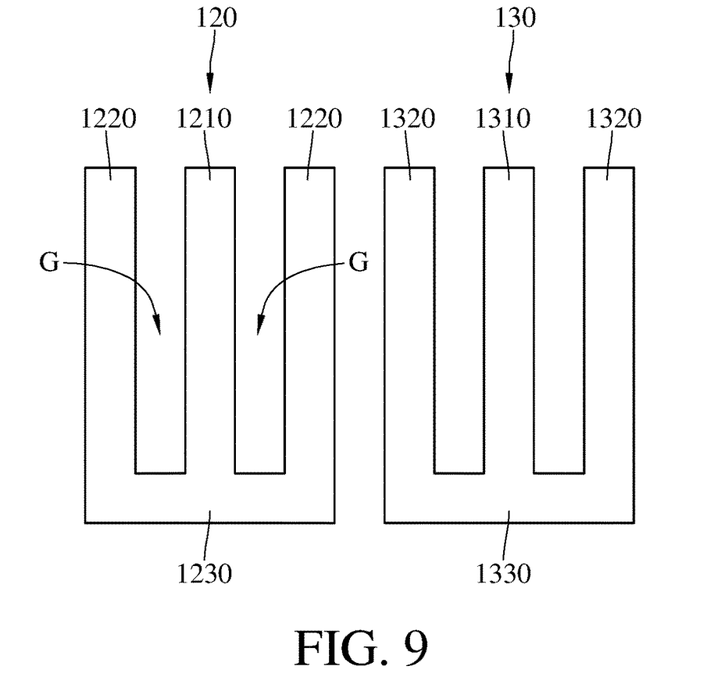
FIG. 9 illustrates a top view of the display substrate according to the eighth embodiment of the present disclosure.

Please refer to FIG. 9, which illustrates a top view of the display substrate 10 according to the eighth embodiment of the present disclosure. The shape of the first bonding pad 120 and the second bonding pad 130 is like a comb in the embodiment shown in FIG. 9. More specifically, the first bonding pad 120 comprises at least one main bonding portion 1210, at least two auxiliary bonding portions 1220 and a connecting portion 1230. The auxiliary bonding portions 1220 are at both side of the main bonding portion 1210 respectively, and there are gaps G between the main bonding portion 1210 and each auxiliary bonding portion 1220. The connecting portion 1230 electrically connects to one end of the auxiliary bonding portion 1220 and one end of the main bonding portion 1210. Practically, the connecting portion 1230 may be disposed simultaneously with the same process as the main bonding portion 1210 and the auxiliary bonding portion 1220. Alternatively, the connecting portion 1230 may be disposed after disposing the main bonding portion 1210 and the auxiliary bonding portion 1220 on the base board 110. It is not limited here.

Figure 10:
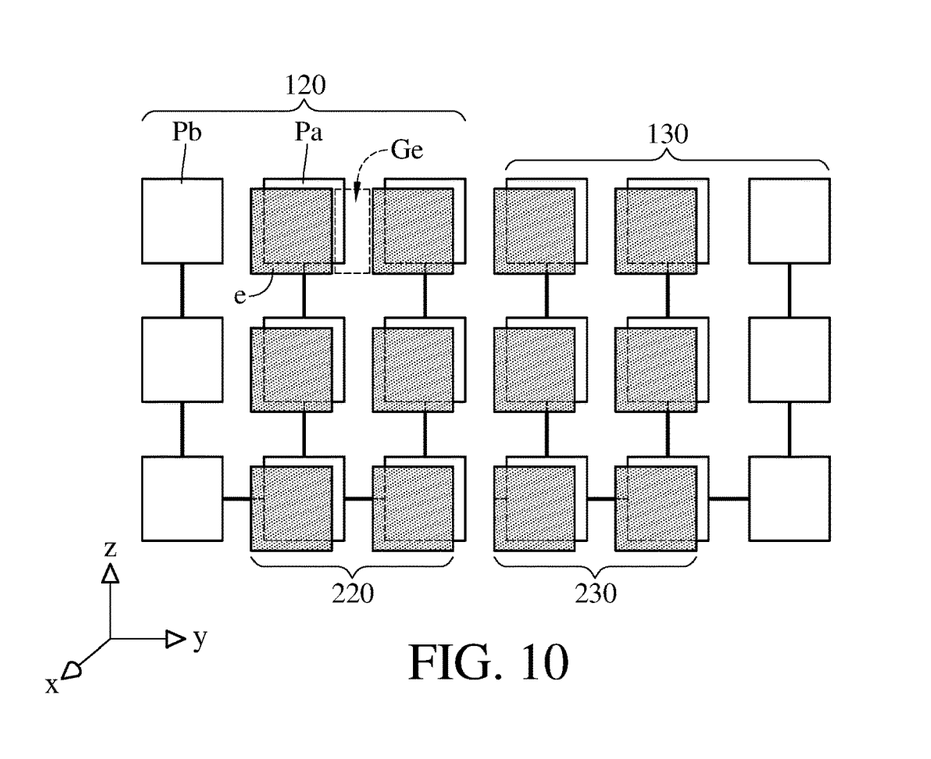
FIG. 10 illustrates a schematic of each sub-electrode of the first electrode and the second electrode and the first bonding pad and the second bonding pad according to the ninth embodiment of the present disclosure.

Please refer to FIG. 10, which illustrates a schematic of each sub-electrode of the first electrode 220 and the second electrode 230 and the first bonding pad 120 and the second bonding pad 130 according to the ninth embodiment of the present disclosure. For the clear illustration, FIG. 10 uses screentone to indicate the electrodes to separate from the bonding pad. The first electrode 220 comprises a plurality of first sub-electrodes e in this embodiment. These first sub-electrodes e electrically connect to each other directly or indirectly. There is an electrode gap Ge between two of these first sub-electrodes e. In other words, except for the patterned first bonding pad 120 and the patterned second bonding pad 130, the first electrode 220 and the second electrode 230 of the light emitting component 20 are also patterned. Therefore, when the light provided by the light emitting component 20 transmits toward the base board 110, the obstacles against the light transmission further reduce and the transmittance of the display panel 1 and the display substrate 10 can be further improved.

In an embodiment, the ratio of the area of the orthogonal projection of the electrode gap Ge on a surface of the light emitting component 20 and the area of the surface of the light emitting component 20 is less than 0.5 is less than or equal to 0.5, otherwise, the uniformity of electrical connection will be affected. In another embodiment, the orthogonal projection of each of the first sub-electrodes e on the base board 110 overlaps at least a part of an orthogonal projection of one of the main bonding blocks Pa3 on the base board 110 or overlaps at least a part of an orthogonal projection of one of the auxiliary bonding blocks Pb1 on the base board 110. In another embodiment, the ratio of the orthogonal projection of each of the first sub-electrodes e on the base board 110 and the overlapping part of an orthogonal projection of each of the first sub-electrodes e on the base board 110 and an orthogonal projection of one of the main bonding blocks Pa3 on the base board 110 is greater than or equal to 0.5, otherwise, the transmittance and the uniformity of the electrical connection will be affected. Alternatively, the ratio of the orthogonal projection of each of the first sub-electrodes e on the base board 110 and the overlapping part of the orthogonal projection of each of the first sub-electrodes e on the base board 110 and the orthogonal projection of one of the auxiliary bonding blocks Pb1 on the base board 110 is greater than or equal to 0.5, otherwise, the transmittance and the uniformity of the electrical connection will be affected.

The contact area of the bonding pad and the corresponding electrode is sufficiently large to maintain the bonding effect according to the above embodiment, and the gaps of the first bonding pad 120 and gaps of the second bonding pad 130 are sufficiently large so that the light provided by the light emitting component 20 may pass through the gaps and the transmittance can be improved.

Figure 11:
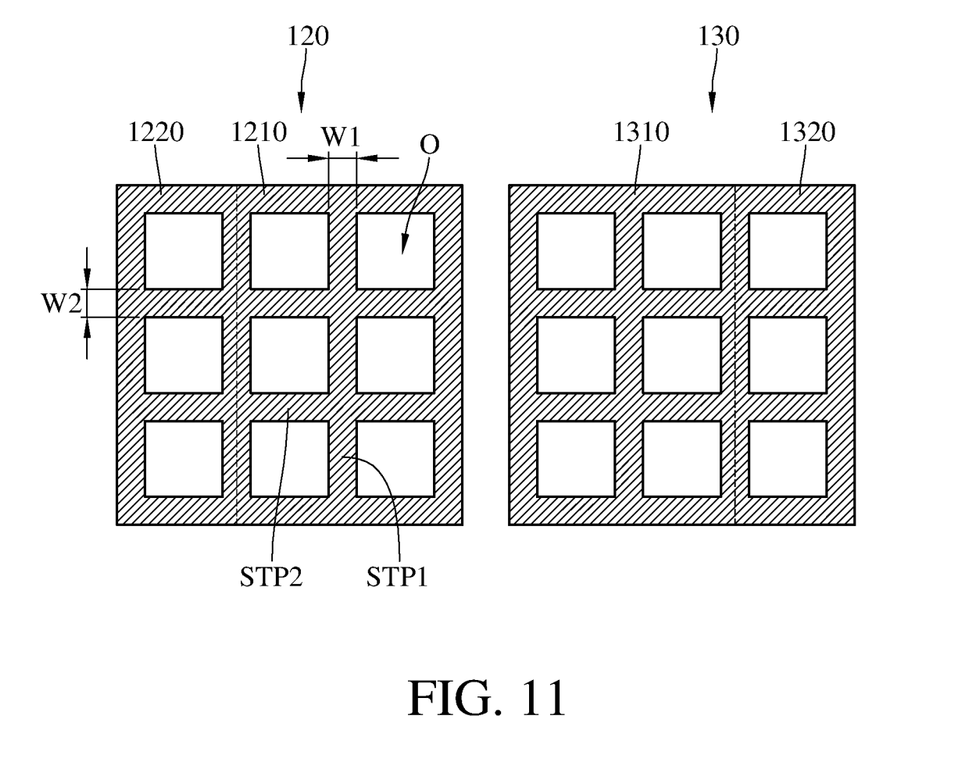
FIG. 11 illustrates a top view of the display substrate according to the tenth embodiment of the present disclosure.

Please refer to FIG. 11, which FIG. 11 illustrates a top view of the display substrate 10 according to the tenth embodiment of the present disclosure. In the tenth embodiment, the first bonding pad 120 and the second bonding pad 130 comprise a plurality of openings O respectively for improving the transmittance of the display panel 1 or the display substrate 10. In another view, the first bonding pad 120 and the second bonding pad are in a mesh shape. In an embodiment, the first bonding pad 120 is formed by interlacing a plurality of bonding gates STP1 and a plurality of bonding gates STP2. The width W1 of the bonding gates STP1 is less than or equal to 6 μm, the distances between adjacent bonding gates is less than or equal to 1 μm, and the width W2 of the bonding gates STP2 is less than or equal to 6 μm, so the light provided by the light emitting component 20 may pass through the first bonding pad 120 and the second bonding pad 130 by diffraction, it is equivalent to increase the transmittance of the display panel 1 and the display substrate 10.

Figure 12:
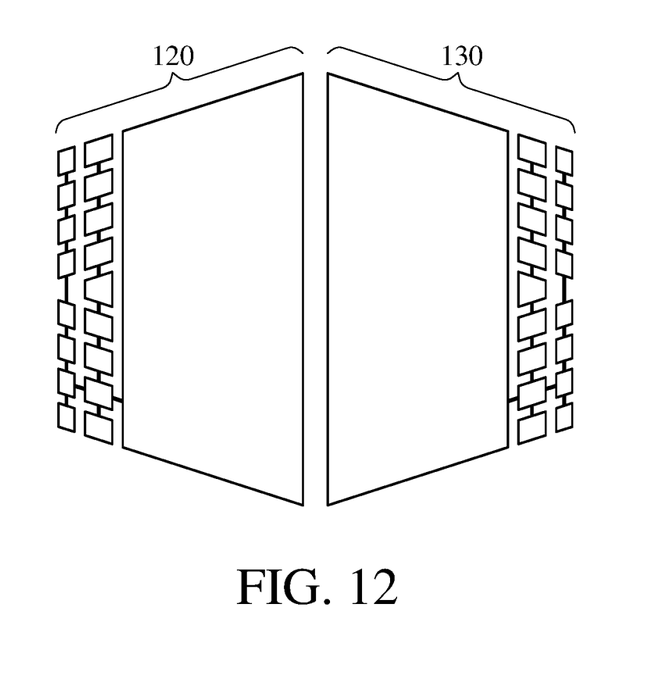
FIG. 12 illustrates a top view of the display substrate according to the eleventh embodiment of the present disclosure.
Figure 13:
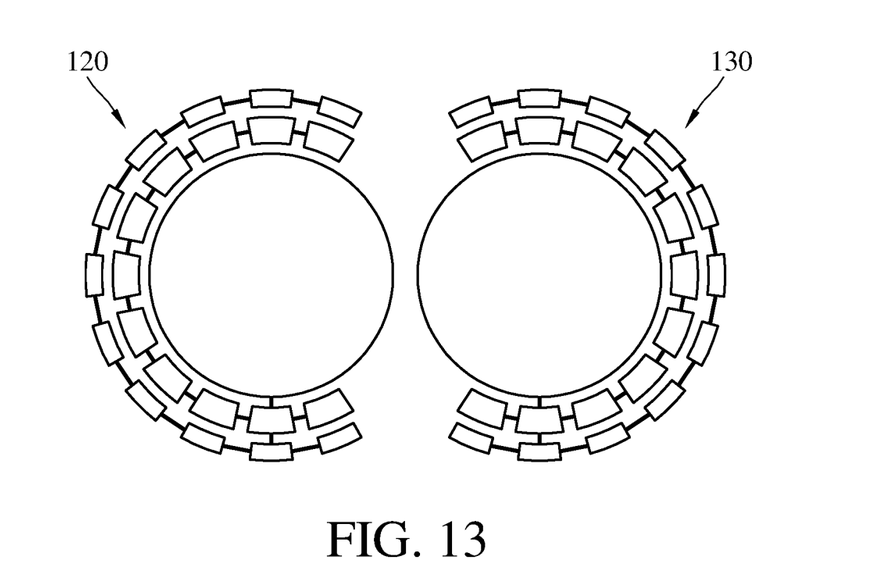
FIG. 13 illustrates a top view of the display substrate according to the twelfth embodiment of the present disclosure.

Please refer to FIGS. 12 and 13. FIG. 12 illustrates a top view of the display substrate 10 according to the eleventh embodiment of the present disclosure. FIG. 13 illustrates a top view of the display substrate 10 according to the twelfth embodiment of the present disclosure. In the above descriptions, the shape of bonding blocks in top view is rectangular and the arrangement of bonding blocks is a 2-dimensional array in rectangular form. However, as shown in FIG. 12 and FIG. 13, the shape of the first bonding pad and the second bonding pad may be a circle, a trapezoid, a triangular or other polygon. Additionally, bonding blocks in the array are not limited to be necessary aligned along rows or columns, meaning that bonding blocks may not be aligned with each other. The person of ordinary skill in the art may refer to the descriptions of the above embodiments to derive other implementation manners after reading the specification. The display substrate and the display panel having gaps in the bonding pads belong to the present disclosure.

In sum, the present disclosure provides a display substrate and a display panel. The first bonding pad is disposed on the display substrate to connect to the electrodes of the light emitting component. The first bonding pad comprises the main bonding portion and the auxiliary bonding portion, and there are gaps between the main bonding portion and the auxiliary bonding portion. In another view, the main bonding portion and the auxiliary bonding portion are disposed discretely so that the first bonding pad has gaps and the first bonding pad does not covers the base board with its entire piece, thus improving the area of transmittance. In one or more embodiment of the present disclosure, the first bonding pad further comprises different implementation conditions on the premise that the electrodes of the light emitting component can be properly connected. As a result, the present disclosure can manufacture said display substrate and said display panel under the current process, and can significantly improve the transmittance of the display substrate and the display panel without affecting the display quality.

What is claimed is:

1. A display substrate comprising:
   a base board with a first surface, wherein the first surface comprises a first bonding district; and
   a first bonding pad disposed on the first surface, wherein a part of the first bonding pad is in the first bonding district, the first bonding pad is directly bonded to a first electrode of a light emitting component at the first bonding district, and the first bonding pad comprises:
      a main bonding portion, wherein at least a part of an orthogonal projection of the main bonding portion on the base board is in the first bonding district; and
      an auxiliary bonding portion electrically connecting to the main bonding portion, wherein at least a part of an orthogonal projection of the auxiliary bonding portion on the base board is outside the first bonding district, and there is a gap between the main bonding portion and the auxiliary bonding portion,
      wherein the main bonding portion and the auxiliary bonding portion are disposed on the same side of the first surface;
      wherein an area of the orthogonal projection of the main bonding portion on the base board is greater than an area of the orthogonal projection of the auxiliary bonding portion on the base board.

2. The display substrate according to claim 1, wherein the auxiliary bonding portion comprises a plurality of auxiliary bonding blocks, the plurality of auxiliary bonding blocks electrically connect to each other, and there is a pad gap between two of the auxiliary bonding blocks.

3. The display substrate according to claim 2, wherein the main bonding portion comprises a plurality of main bonding blocks, the plurality of main bonding blocks electrically connect to each other, and there is a pad gap between two of the main bonding blocks.

4. The display substrate according to claim 3, wherein an area of an orthogonal projection of one of the main bonding blocks on the base board is greater than or equal to an area of an orthogonal projection of one of the auxiliary bonding blocks on the base board.

5. The display substrate according to claim 3, wherein a width of each of the main bonding blocks is less than or equal to 6 micrometers and a width of each of the auxiliary bonding blocks is less than or equal to 6 micrometers.

6. The display substrate according to claim 3, wherein the base board further comprises a tolerance district and a discrete district, the tolerance district is closer to the first bonding district than the discrete district, the plurality of auxiliary bonding blocks are in the tolerance district or in the discrete district, a distance between any one of the auxiliary bonding blocks in the tolerance district and the first bonding district is smaller than a distance between any one of the auxiliary bonding blocks in the discrete district and the first bonding district, and a total area of an orthogonal projection of auxiliary bonding portion on the tolerance district is greater than a total area of an orthogonal projection of the auxiliary bonding portion on the discrete district.

7. The display substrate according to claim 6, wherein an area of an orthogonal projection of one of the auxiliary bonding blocks in the tolerance district on the base board is greater than an area of an orthogonal projection of one of the auxiliary bonding blocks in the discrete district on the base board.

8. The display substrate according to claim 6, wherein a number of the auxiliary bonding blocks in the tolerance district is greater than a number of the auxiliary bonding blocks in the discrete district.

9. The display substrate according to claim 1, wherein the base board further comprises a second bonding district, the display substrate further comprises a second bonding pad disposed on the base board, the second bonding pad is configured to electrically connect to a second electrode of the light emitting component at the second bonding district, and the first bonding pad and the second bonding pad are symmetric with respect to an axis of symmetry between the first bonding district and the second bonding district.

10. The display substrate according to claim 1, wherein
at least a part of an orthogonal projection of the main bonding portion on the base board is located within an orthogonal projection of the first electrode on the base board; and
at least a part of the orthogonal projection of the auxiliary bonding portion on the base board is located outside the orthogonal projection of the first electrode on the base board.

11. The display substrate according to claim 1, wherein
an orthogonal projection of the light emitting component on the base board overlaps orthogonal projections of the main bonding portion and the auxiliary bonding portion on the base board.

12. A display panel comprising:
a light emitting component with a first electrode and a second electrode; and
a display substrate, comprising:
a base board with a first surface, wherein the first surface comprises a first bonding district; and
a first bonding pad disposed on the first surface, wherein a part of first bonding pad is in the first bonding district, the first bonding pad is directly bonded to the first electrode of the light emitting component at the first bonding district, and the first bonding pad comprises:
a main bonding portion, wherein at least a part of an orthogonal projection of the main bonding portion on the base board is in the first bonding district; and
an auxiliary bonding portion electrically connecting to the main bonding portion, wherein at least a part of an orthogonal projection of the auxiliary bonding portion on the base board is outside the first bonding district, and there is a gap between the main bonding portion and the auxiliary bonding portion,
wherein the main bonding portion and the auxiliary bonding portion are disposed on the same side of the first surface;
wherein an area of the orthogonal projection of the main bonding portion on the base board is greater than an area of the orthogonal projection of the auxiliary bonding portion on the base board.

13. The display panel according to claim 12, wherein the auxiliary bonding portion comprises a plurality of auxiliary bonding blocks, the auxiliary bonding blocks electrically connect to each other, and there is a pad gap between two of the auxiliary bonding blocks.

14. The display panel according to claim 13, wherein the main bonding portion comprises a plurality of main bonding blocks, the main bonding blocks electrically connect to each other, and there is a pad gap between two of the main bonding blocks.

15. The display panel according to claim 14, wherein an area of an orthogonal projection of one of the main bonding blocks on the base board is greater than or equal to an area of an orthogonal projection of one of the auxiliary bonding blocks on the base board.

16. The display panel according to claim 14, wherein the first electrode further comprises a plurality of first sub-electrodes, the plurality of first sub-electrodes electrically connect to each other, there is an electrode gap between two of the first sub-electrodes.

17. The display panel according to claim 13, wherein a contact area of the first electrode and the first bonding pad is less than or equal to an area of an orthogonal projection of the first electrode on the base board.

18. The display panel according to claim 17, wherein a ratio of the contact area of the first electrode and the first bonding pad and the area of an orthogonal projection of the first electrode on the base board is less than or equal to 0.8 and greater than or equal to 0.2.

19. The display panel according to claim 13, wherein a contact area of the first electrode and the first bonding pad is less than or equal to an area of an orthogonal projection of the light emitting component on the base board.

20. The display panel according to claim 19, wherein a ratio of the contact area of the first electrode and the first bonding pad and the area of an orthogonal projection of the light emitting component on the base board is less than or equal to 0.8.

21. The display panel according to claim 16, wherein a ratio of an area of an orthogonal projection of the electrode gap on a surface of the light emitting component and an area of the surface of the light emitting component is less than 0.5.

22. The display panel according to claim 16, wherein an orthogonal projection of each of the first sub-electrodes on the base board overlaps at least a part of an orthogonal projection of one of the main bonding blocks on the base board or overlaps at least a part of an orthogonal projection of one of the auxiliary bonding blocks on the base board.

23. The display panel according to claim 22, wherein a ratio of an orthogonal projection of each of the first sub-electrodes on the base board and an overlapping part of an orthogonal projection of each of the first sub-electrodes on the base board and an orthogonal projection of one of the main bonding blocks on the base board is greater than or equal to 0.5, or a ratio of an orthogonal projection of each of the first sub-electrodes on the base board and an overlapping part of an orthogonal projection of each of the first sub-electrodes on the base board and an orthogonal projection of one of the auxiliary bonding blocks on the base board is greater than or equal to 0.5.

24. The display panel according to claim 12, wherein
at least a part of an orthogonal projection of the main bonding portion on the base board is located within an orthogonal projection of the first electrode on the base board; and
at least a part of the orthogonal projection of the auxiliary bonding portion on the base board is located outside the orthogonal projection of the first electrode on the base board.

25. The display panel according to claim 12, wherein
an orthogonal projection of the light emitting component on the base board overlaps orthogonal projections of the main bonding portion and the auxiliary bonding portion on the base board.

* * * * *